(12) United States Patent  
Loeda

(10) Patent No.: US 8,324,978 B2  
(45) Date of Patent: Dec. 4, 2012

(54) CRYSTAL OSCILLATOR CLOCK CIRCUIT

(75) Inventor: Sebastian Loeda, Edinburgh (GB)

(73) Assignee: Elonics Limited, Livingston (GB)

( * ) Notice: Subject to any disclaimer, the term of this patent is extended or adjusted under 35 U.S.C. 154(b) by 0 days.

(21) Appl. No.: 12/936,023

(22) PCT Filed: Mar. 25, 2009

(86) PCT No.: PCT/GB2009/050283  
§ 371 (c)(1),  
(2), (4) Date: Nov. 2, 2010

(87) PCT Pub. No.: WO2009/122198  
PCT Pub. Date: Oct. 8, 2009

(65) Prior Publication Data  
US 2011/0260803 A1    Oct. 27, 2011

(30) Foreign Application Priority Data  
Apr. 4, 2008 (GB) .................................. 0806138.4

(51) Int. Cl.  
*H03L 5/00* (2006.01)

(52) U.S. Cl. .............. 331/183; 331/116 R; 331/116 FE; 331/158

(58) Field of Classification Search .................... 331/46, 331/158, 183, 116 R, 116 FE, 185  
See application file for complete search history.

(56) References Cited

U.S. PATENT DOCUMENTS

| | | | |
|---|---|---|---|
| 4,358,742 A | 11/1982 | Ferriss | |
| 5,453,719 A * | 9/1995 | Narahara | .................... 331/49 |
| 6,118,348 A * | 9/2000 | Narahara | ............... 331/116 FE |
| 2006/0071729 A1 | 4/2006 | Cetin et al. | |

FOREIGN PATENT DOCUMENTS

EP        0110719 A1    6/1984

OTHER PUBLICATIONS

Aouichi, Mohamed, "International Search Report", for PCT/GB2009/050283 as mailed Sep. 21, 2009, 2 pages.

* cited by examiner

*Primary Examiner* — Arnold Kinkead  
(74) *Attorney, Agent, or Firm* — Winstead PC

(57) ABSTRACT

A crystal oscillator clock circuit which facilitates switching its output between an internally generated clock signal and an externally generated clock signal. A feedback loop detects the presence of an externally generated clock signal applied to an output pin of a crystal oscillator circuit and powers down the internally generated clock signal. As a result, the crystal oscillator clock circuit simply passes the externally generated clock signal as its output signal.

8 Claims, 2 Drawing Sheets

CRYSTAL OSCILLATOR CLOCK CIRCUIT

The present invention relates to the field of electronic circuits and in particular to crystal oscillator clock circuits.

All communication systems require at least one accurate reference clock. Often, the reference clock is common to many modules of the complete communication system and may be generated within another module located elsewhere within the system.

Crystal oscillator clock circuits are a common approach to generating the required clock signals. A schematic representation of a prior art crystal oscillator clock circuit 1 is presented in FIG. 1. In this circuit a crystal oscillator 2 is connected across a variable gain amplifier (VGA) 3 so as to output an internally generated clock signal 4 for the communication system. The oscillator clock circuit 1 further comprises a crystal oscillator input pin 5 and a crystal oscillator output pin 6.

If the VGA 3 produces enough gain to compensate for the resistive loss in the crystal oscillator 2, a growing electrical oscillation will occur. The larger the electrical oscillation, the less noise-prone the internally generated clock signal 4 will be. It is known to those skilled in the art however that for a low jitter, internally generated clock signal 4, the output of the VGA 3 should be limited to operate within its linear output range.

As the amplitude of the output of the VGA 3 increases, it will eventually be limited to the power rails, producing a saturated (rectangular) internally generated clock signal 4. A rectangular signal contains many harmonic frequencies which exercise unwanted harmonic paths within the crystal oscillator 2 and so results in the internally generated clock signal 4 exhibiting greater timing jitter.

A known solution to this problem is to introduce an automatic gain control (AGC) block 7 within a feedback loop 8 of the VGA 3, as shown schematically in the crystal oscillator clock circuit 9 of FIG. 2. The AGC block 7 measures the amplitude of the output of the VGA 3 and controls the gain of the VGA 3 such that its output remains near the edge of its linear range. If the output amplitude is too low, e.g. at start-up, the gain control will be set high to compensate. Alternatively, if the output amplitude is too high, the gain control will drop. The value the gain control settles so as to depend on the corner of the process and on the resistivity of the crystal oscillator 2.

There are often occasions when it is desirable to introduce an externally generated clock signal to a communication system so as to effectively bypass the previously described internally generated clock signal 4. In order to avoid the internally generated clock signal 4 from detrimentally interfering with the external clock signal it is necessary to electrically isolate the relevant circuits e.g. 1 or 9, or alternatively disable the crystal oscillator 2.

The prior art solution to this problem is to introduce an additional clock selection input signal. This requires hardwiring external software to circuits 1 or 9 so providing a product specific implementation. Such a solution requires the employment of an independent dedicated pin within the circuit so as to provide a means for switching between the internally generated clock signal 4 and the externally generated clock signal, as required.

It is therefore an object of aspects of the present invention to provide a crystal oscillator clock circuit which facilitates switching its output between an internally generated clock signal and an externally generated clock signal.

SUMMARY OF INVENTION

According to a first aspect of the present invention there is provided a feedback loop for a variable gain amplifier of crystal oscillator clock circuit the feedback loop comprising a detector that provides a means for detecting the presence of an externally generated clock signal applied to an output pin of a crystal oscillator circuit and a switch, wherein on detection of the externally generated clock signal the switch is reconfigured so as power down the variable gain amplifier.

By powering down the variable gain amplifier the internally generated clock signal is effectively turned off. As a result, the crystal oscillator clock circuit simply passes the externally generated clock signal as its output signal. Advantageously, there are no detrimental effects imparted onto the externally generated clock signal by the internally generated clock signal.

Most preferably the detector comprises a comparator arranged to compare the amplitude of an output of an automatic gain control block with an amplitude of a predetermined reference signal.

Preferably an output of the comparator is logic high when the amplitude of the output of the automatic gain control block is greater than the amplitude of the predetermined reference signal.

Preferably the switch comprises a multiplexer having a first input connected to the output of the automatic gain control block and a second input connected to electrical ground.

Most preferably the output of the comparator provided a multiplexer clock signal so as to provide a means for switching a multiplexer output signal between the output of the automatic gain control block and electrical ground.

Preferably the comparator comprises an inherent hysteresis. The inherent hysteresis of the comparator introduces a time delay to the switching between the modes of operation of crystal oscillator clock circuit. In this way a rapid toggling between the modes of operation is prevented.

According to a second aspect of the present invention there is provided a crystal oscillator clock circuit the circuit comprising a crystal oscillator, having an output pin, the crystal oscillator being electrically connected across a variable gain amplifier wherein the variable gain amplifier comprising a feedback loop in accordance with the first aspect of the present invention.

According to a third aspect of the present invention there is provided a method switching an output of a crystal oscillator clock circuit between an internally generated clock signal and an externally generated clock signal, the method comprising the steps of:
1) detecting the presence of the externally generated clock signal applied to an output pin of a crystal oscillator; and
2) powering down one or more electrical components employed to produce the internally generated clock signal.

Most preferably the method further comprises the step of powering up the one or more electrical components when the externally generated clock signal is not detected.

Preferably the step of detecting presence of the externally generated clock signal comprises comparing the amplitudes of an output of an automatic gain control block and a predetermined reference signal.

Preferably when the amplitude of the output of the automatic gain control block is less than the amplitude of the predetermined reference signal the one or more electrical components are powered down.

Preferably when the amplitude of the output of the automatic gain control block is greater than the amplitude of the predetermined reference signal the one or more electrical components are powered up.

BRIEF DESCRIPTION OF DRAWINGS

Aspects and advantages of the present invention will become apparent upon reading the following detailed description and upon reference to the following drawings in which.

DETAILED DESCRIPTION

Figure 1:
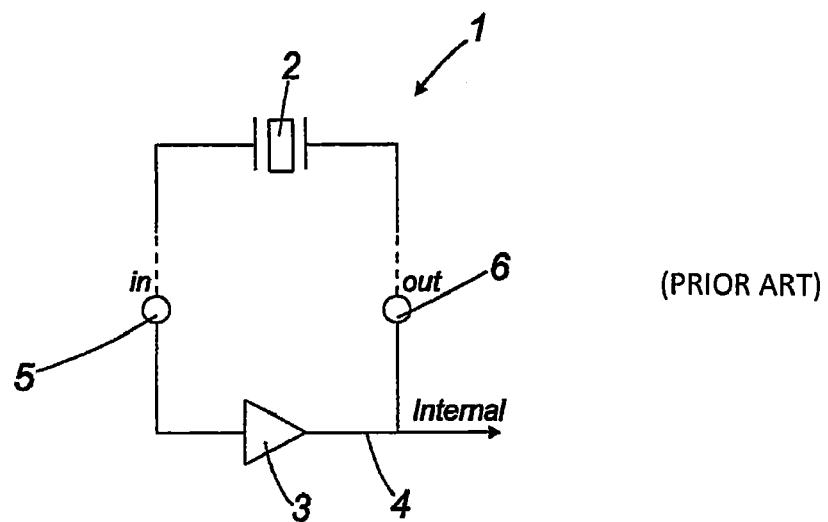
FIG. 1 presents a schematic representation of a first prior art crystal oscillator clock circuit.
Figure 2:
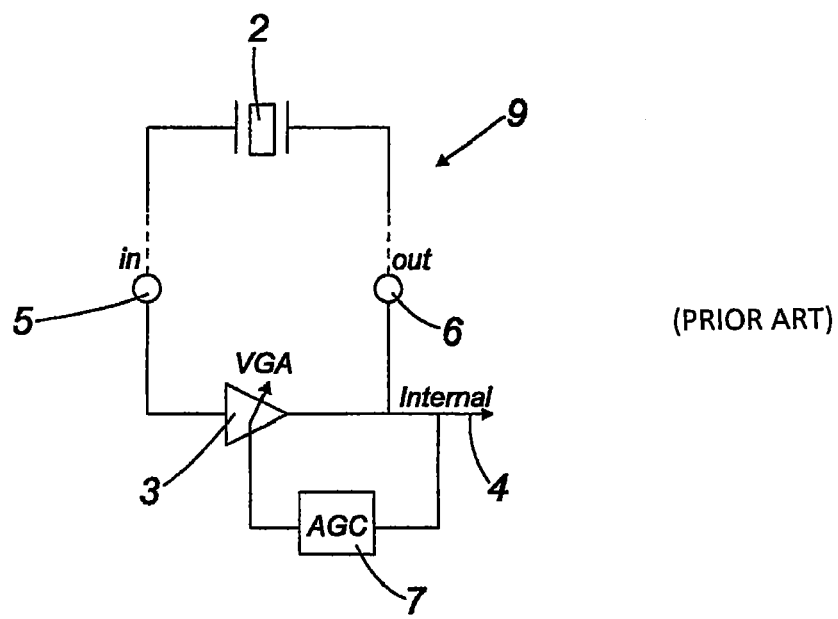
FIG. 2 presents a schematic representation of a second prior art crystal oscillator clock circuit.

Aspects and embodiments of the present invention will now be described with reference to FIG. 3 which presents a schematic representation of a crystal oscillator clock circuit 10. For ease of understanding, those features in common with the previously described, prior art crystal oscillator clock circuits, 1 and 9, are referred by common reference numerals throughout the following description.

The crystal oscillator clock circuit 10 can be seen to comprise a crystal oscillator 2, having a crystal oscillator input pin 5 and output pin 6, connected across a VGA 3 so as to provide an internally generated clock signal 4 for a communication system.

A feedback loop 11 is located across the VGA 3. Located within the feedback loop 11 is an AGC block 7, a comparator 12 with inherent hysteresis, and a multiplexer 13. The AGC block 7 is connected to a first comparator input 14 and a first multiplexer input 15. Connected to a second comparator input 16 is a predetermined low amplitude reference signal 17 while a second multiplexer input 18 is connected to electrical ground. A comparator output signal 19 is arranged to provide a multiplexer clock signal 20. Finally, a multiplexer output signal 21 completes the feedback loop to the VGA 3.

Figure 3:
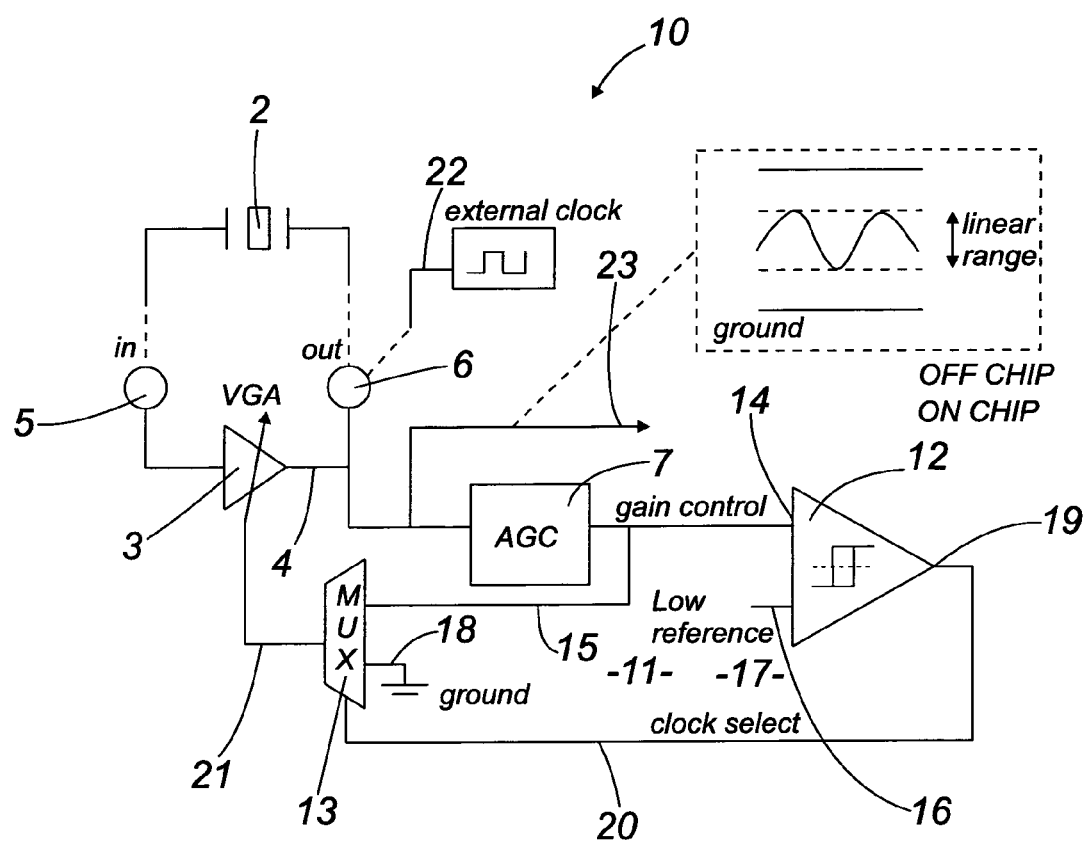
FIG. 3 presents a schematic representation of a crystal oscillator clock circuit in accordance with an aspect of the present invention.

As can be seen from FIG. 3, an externally generated clock signal 22 can be provided to the crystal oscillator clock circuit 10 via the crystal oscillator output pin 6.

The arrangement of the crystal oscillator clock circuit 10 is such that in a first mode of operation (i.e. in the absence of the externally generated clock signal 22) an output signal 23 is the internally generated clock signal 4. Alternatively, in a second mode of operation (i.e. in the presence of the externally generated clock signal 22 having an amplitude greater than the linear range of the VGA 3) the output signal 23 is the externally generated clock signal 22. These two modes of operation shall now be described in further detail.

In the first mode of operation the internally generated clock signal 4 is produced by the combined effects of the crystal oscillator 2 the VGA 3 and the AGC block 7, in a similar manner to that described above. The comparator 12 then compares the internally generated clock signal 4 with the low amplitude reference signal 17. Since the amplitude of the internally generated clock signal 4 is greater than that of low amplitude reference signal 17 the comparator output signal 19 is set to be logic high. A logic high multiplexer clock signal 20 results in the multiplexer 13 passing the internally generated clock signal 4 from the first multiplexer input 15 as the multiplexer output signal 21 to the VGA 3. Therefore, in the first mode of operation the crystal oscillator clock circuit 10 replicates the operation of prior art crystal oscillator clock circuit 9 and so passes the internally generated clock signal 4 as its output signal 23.

When the externally generated clock signal 22 is introduced the AGC block 7 acts to drop the gain control to near zero. The comparator 12 then compares a near zero amplitude internally generated clock signal 4 with the low amplitude reference signal 17.

Since the amplitude of the internally generated clock signal 4 is now lower than that of low amplitude reference signal 17 the comparator output signal 19 is set to be logic low. A logic low multiplexer clock signal 20 results in the multiplexer 13 toggling to the electrical ground of the second multiplexer input 18. The multiplexer output signal 21 to the VGA 3, is effectively turned of resulting in the VGA 3 being powered down. The crystal oscillator clock circuit 10 thus operates so as to output the externally generated clock signal 22 as the output signal 23 with no detrimental effects resulting from the internally generated clock signal 4.

As soon as the externally generated clock signal 22 is removed, the AGC block 7 will act to increase the gain control above the low amplitude reference signal 17 and thus the VGA 3 will again be powered up. The crystal oscillator clock circuit 10 thus returns to the first mode of operation wherein the output signal 23 is again the internally generated clock signal 4.

A point to note is that the inherent hysteresis of the comparator 12 introduces a time delay to the switching between the modes of operation of crystal oscillator clock circuit 10. In this way a rapid toggling between the modes of operation is prevented.

From the above discussion it can be seen that while the externally generated clock signal is applied, the VGA 3 will not interfere with the output signal 23 and only the AGC block 7 and comparator 12 remain on. These two elements can therefore be designed to be of low power thus reducing the overall power usage of the crystal oscillator clock circuit 10.

It will be readily appreciated by those skilled in the art that crystal oscillator clock circuit 10 offers several further key advantages of the circuits of the prior art. The self de-selection of the crystal oscillator 2, in the presence of the externally generated clock signal 22, results in no detrimental jitter due to the operation of VGA 3 upon the output signal 23.

The described solution is a simple, non-invasive extension to existing crystal oscillator architecture and therefore provides for integration, and thus retrofitting, with existing products with only minimal changes to the electrical circuits.

Employing a self detection methodology is found to be more reliable, since this does not depend on an error prone register.

The presently described invention is not external software dependent and is thus found to be more user friendly. In an external software solution, the default has to be hard-wired to the specific product implementation, as a deadlock would otherwise arise at reset. This problem is avoided by the presently described solution.

Finally, the present solution avoids the need for a dedicated external pin and so results in an area saving within the described circuitry.

The foregoing description of the invention has been presented for purposes of illustration and description and is not intended to be exhaustive or to limit the invention to the precise form disclosed. The described embodiments were chosen and described in order to best explain the principles of the invention and its practical application to thereby enable others skilled in the art to best utilise the invention in various embodiments and with various modifications as are suited to the particular use contemplated. Therefore, further modifications or improvements may be incorporated without departing from the scope of the invention as defined by the appended claims.

The invention claimed is:

1. A crystal oscillator clock circuit comprising:
   a variable gain amplifier;
   a crystal oscillator, having an output pin, connected across the variable gain amplifier to provide an internally generated clock signal;
   a feedback loop located across the variable gain amplifier comprising a detector arranged to detect the presence of an externally generated clock signal having an amplitude greater than the linear range of the variable gain amplifier applied to the output pin and to output a detection signal;
   a switch configured to power down said variable gain amplifier in response to said detection signal so that the output pin outputs the externally generated clock signal when said externally generated clock signal is detected, and outputs the internally generated clock signal when no externally generated clock signal is detected; and
   wherein the detector comprises a comparator arranged to compare the amplitude of an output of an automatic gain control block with the amplitude of a predetermined reference signal.

2. A crystal oscillator clock circuit as defined in claim 1, wherein an output of the comparator is logic high when the amplitude of the output of the automatic gain control block is greater than the amplitude of the predetermined reference signal.

3. A crystal oscillator clock circuit as defined in claim 1, wherein the feedback loop further comprises a multiplexer having a first input connected to the output of the automatic gain control block and a second input connected to electrical ground.

4. A crystal oscillator clock circuit as defined in claim 1, wherein the output of the comparator provides a multiplexer clock signal so as to provide a means for switching a multiplexer output signal between the output of the automatic gain control block and electrical ground.

5. A crystal oscillator clock circuit as defined in claim 1, wherein the comparator comprises an inherent hysteresis that introduces a time delay when switching between modes of operation of the crystal oscillator clock circuit.

6. A method of producing a clock signal using a crystal oscillator clock circuit comprising a variable gain amplifier and a crystal oscillator, the method comprising the steps of:
   a) generating an internally generated clock signal;
   b) outputting the internally generated clock signal from an output pin when no externally generated clock signal is detected;
   c) detecting the presence of an externally generated clock signal having an amplitude greater than the linear range of the variable gain amplifier applied to an output pin of the crystal oscillator and outputting a detection signal;
   d) outputting the externally generated clock signal from the output pin when said externally generated clock signal is detected by powering down the variable gain amplifier in response to said detection signal;
   e) powering up one or more electrical components when the externally generated clock signal is not detected; and
   wherein the step of detecting the presence of an externally generated clock signal comprises comparing the amplitudes of an output of an automatic gain control block and a predetermined reference signal.

7. A method as defined in claim 6, wherein when the amplitude of the output of the automatic gain control block is less than the amplitude of the predetermined reference signal one or more electrical components are powered down.

8. A method as defined in claim 6, wherein when the amplitude of the output of the automatic gain control block is greater than the amplitude of the predetermined reference signal one or more electrical components are powered up.

* * * * *